US008790936B2

(12) United States Patent
Yasuda

(10) Patent No.: US 8,790,936 B2
(45) Date of Patent: Jul. 29, 2014

(54) METHOD FOR MANUFACTURING OPTICAL DEFLECTOR FOR FORMING DICING STREET WITH DOUBLE ETCHING

(75) Inventor: Yoshiaki Yasuda, Yokohama (JP)

(73) Assignee: Stanley Electric Co., Ltd., Tokyo (JP)

( * ) Notice: Subject to any disclaimer, the term of this patent is extended or adjusted under 35 U.S.C. 154(b) by 102 days.

(21) Appl. No.: 13/613,847

(22) Filed: Sep. 13, 2012

(65) Prior Publication Data

US 2013/0084661 A1  Apr. 4, 2013

(30) Foreign Application Priority Data

Sep. 29, 2011 (JP) ................. 2011-215622

(51) Int. Cl.
    *H01L 21/00* (2006.01)
    *H01L 27/14* (2006.01)
    *G02B 26/08* (2006.01)
(52) U.S. Cl.
    USPC ............ 438/22; 438/24; 438/26; 438/27; 438/29; 438/33; 257/414; 257/428; 257/431; 359/199.4; 359/200.8; 359/224.1
(58) Field of Classification Search
    USPC ............ 438/22, 24, 26, 27, 29, 33; 257/414, 257/428, 431, 432; 359/199.4, 200.8, 224.1
    See application file for complete search history.

(56) References Cited

U.S. PATENT DOCUMENTS 8,456,727 B2 * 6/2013 Yasuda ............ 359/224.1
8,553,306 B2 * 10/2013 Saitoh et al. ......... 359/200.8
2005/0124159 A1 6/2005 Kalvesten et al.
2008/0212162 A1 9/2008 Ichikawa et al.
2009/0061596 A1 3/2009 Takahashi et al.
2009/0149004 A1 6/2009 Ichikawa et al.
2011/0226299 A1 9/2011 Makansi
2011/0292479 A1 12/2011 Hiraoka et al.

FOREIGN PATENT DOCUMENTS

| JP | 2005-19966 A | 1/2005 |
| JP | 2008-020701 A | 1/2008 |
| JP | 2009-223165 A | 10/2009 |
| JP | 2010-122480 A | 6/2010 |

OTHER PUBLICATIONS

Extended European Search Report (EESR) dated Jan. 21, 2013 (in English) issued in counterpart European Application No. 12006663.4.

* cited by examiner

*Primary Examiner* — Hsien Ming Lee

(74) *Attorney, Agent, or Firm* — Holtz Holtz Goodman & Chick PC

(57) ABSTRACT

A wafer-level optical deflector assembly is formed on a front surface side of a wafer. Then, the front surface side of the wafer is etched by using elements of the wafer-level optical deflector assembly, to form a front-side dicing street. Then, a transparent substrate with an inside cavity is adhered to the front surface side of the wafer. Then, a second etching mask is formed on a back surface side of the wafer. Then, the back surface side of the wafer is etched to create a back-side dicing street. Then, an adhesive sheet with a ring-shaped rim is adhered to the back surface side of the wafer. Then, the transparent substrate is removed. Finally, the ring-shaped rim is expanded to widen the front-side dicing street and the back-side dicing street to pick up optical deflectors one by one from the wafer.

12 Claims, 9 Drawing Sheets

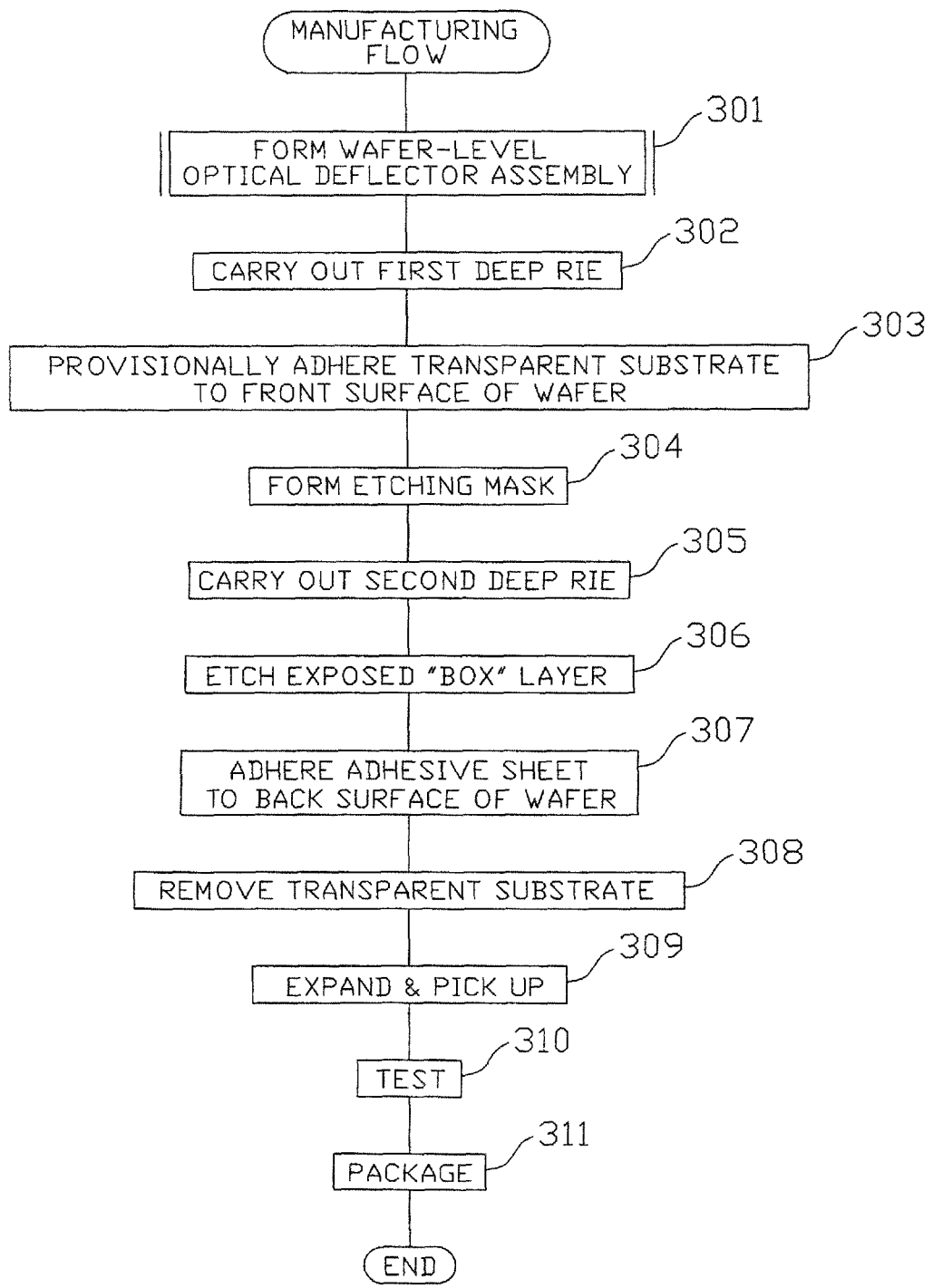

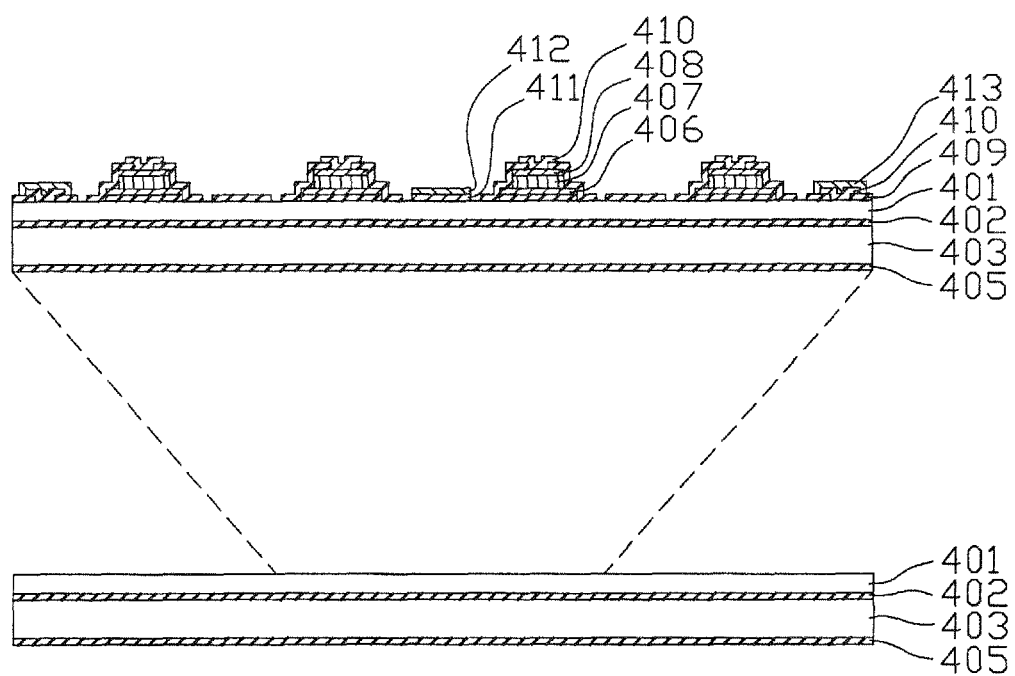

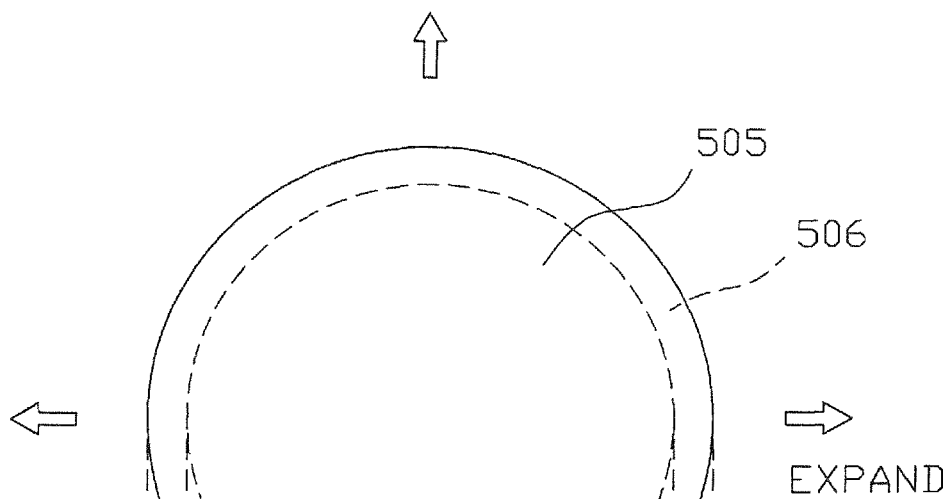
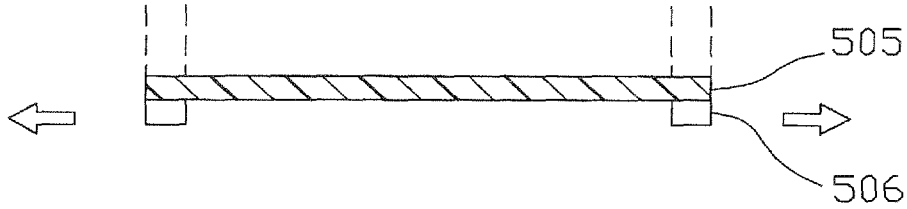

METHOD FOR MANUFACTURING OPTICAL DEFLECTOR FOR FORMING DICING STREET WITH DOUBLE ETCHING

This application claims the priority benefit under 35 U.S.C. §119 to Japanese Patent Application No. JP2011-215622 filed on Sep. 29, 2011, which disclosure is hereby incorporated in its entirety by reference.

BACKGROUND

1. Field

The presently disclosed subject matter relates to a method for manufacturing an optical deflector which can be applied to a projection-type display system, for example.

2. Description of the Related Art

Recently, in a projection-type display system, a spotlight from a light source is deflected by an optical deflector and then, is projected onto a screen. The optical deflector includes a two-dimensional optical deflector chip which is a micro electro mechanical system (MEMS) device manufactured by using semiconductor manufacturing processes and micro machine technology, and a package for protecting the two-dimensional optical deflector chip.

Generally, the two-dimensional optical deflector includes a mirror for reflecting a spotlight from a light source, a movable frame surrounding the mirror for supporting the mirror, an inner actuator for vibrating (rocking) the mirror with respect to an X-axis of the mirror, a support body surrounding the movable frame, and an outer actuator for rocking the mirror through the movable frame with respect to a Y-axis of the mirror perpendicular to the X-axis.

As a first example, the inner actuator is constructed by torsion-bar type piezoelectric actuators for rocking the mirror through torsion bars, and the outer actuator is constructed by other torsion-bar type piezoelectric actuators for rocking the movable frame through other torsion bars (see: JP2008-20701A). Also, as a second example, the inner actuator is constructed by torsion-bar type piezoelectric actuators for rocking the mirror through torsion bars, and the outer actuator is constructed by meander type piezoelectric actuators for rocking the movable frame (see: JP2009-223165A). Further, as a third example, the inner actuator is constructed by meander type piezoelectric actuators for rocking the mirror, and the outer actuator is constructed by other meander type piezoelectric actuators for rocking the movable frame (see: JP2010-122480A and US2011/0292479A1).

The optical deflector has an advantage in that the structure is small and simple and the drive power is not so large. In order to effectively exhibit this advantage, the package is preferably as small as possible.

In a first prior art method for manufacturing an optical deflector, an optical deflector chip is die-bonded by using resin to a ceramic package, and then, a wire-bonding operation is performed between electrode pads of the optical deflector chip and electrode pads of the ceramic package.

In the above-described first prior art method, however, since spacing for bonding wires is required in the ceramic package, the ceramic package would be larger in size than the optical deflector chip. Also, since the ceramic package is sintered, the size in step and the width in periphery of the ceramic package cannot be reduced. Thus, the entire optical deflector would be large in size. Note that, if the optical deflector chip per se is reduced in size, it may be possible to reduce the entire optical deflector. In this case, however, the optical deflector chip needs to be redesigned to increase the developing period.

In a second prior art method for manufacturing an optical deflector, a wireless wafer-level package technology is adopted (see: JP2005-19966A). That is, a silicon wafer on which a plurality of MEMS chips corresponding to optical deflector chips are arranged is adhered to a cap wafer on which sealing caps are arranged. Then, through silicon vias (TSVs) are formed within the silicon wafer to electrically connect the MEMS chips to electrodes on the external surface of the silicon wafer. Finally, the silicon wafer and the cap wafer are diced along scribing lines thereof by using dicing blades or the like to separate one of the MEMS chips associated with one of the sealing caps from each other. Thus, the size of each of the diced sealing caps is the same as that of the diced MEMS chips, so that the entire optical deflector would be reduced in size.

In the above-described second prior art method, however, since the TSVs need to be formed within the silicon wafer, the manufacturing yield would be reduced, so that the manufacturing cost would be increased.

Also, even if the silicon wafer includes defective MEMS chips, such defective MEMS chips would be assembled by sealing caps, which also would increase the manufacturing cost.

Further, when the silicon wafer is diced by a dicing process using dicing blades, very small defects, i.e., so-called tipping would be generated in the MEMS chips of the silicon wafer, so that the manufacturing yield would be reduced, which further would increase the manufacturing cost.

SUMMARY

The presently disclosed subject matter seeks to solve one or more of the above-described problems.

According to the presently disclosed subject matter, in a method for manufacturing an optical deflector, a wafer-level optical deflector assembly is formed on a front surface side of a wafer. Then, the front surface side of the wafer is etched by using elements of the wafer-level optical deflector assembly as a first etching mask, to form a front-side dicing street in the front surface side of the wafer. Then, a transparent substrate with an inside cavity is provisionally adhered to the front surface side of the wafer, in such a way that the inside cavity of the transparent substrate opposes movable elements of the wafer-level optical deflector assembly. Then, a second etching mask is formed on a back surface side of the wafer. Then, the back surface side of the wafer is formed by using the second etching mask in such a way that a cavity opposing the movable elements of the wafer-level optical deflector assembly and a back-side dicing street are created in the back surface side of the wafer. In this case, the back-side dicing street leads to the front-side dicing street. Then, an adhesive sheet with a ring-shaped rim is adhered to the back surface side of the wafer. Then, the transparent substrate is removed from the front surface side of the wafer. Finally, the ring-shaped rim is expanded to widen the front-side dicing street and the back-side dicing street to pick up optical deflectors one by one from the wafer.

Preferably, the wafer comprises a silicon-on-insulator wafer including a silicon "Device" layer, a silicon dioxide "Box" layer and a silicon "Handle" layer in this sequence. The front surface side etching comprises performing a first deep reactive ion etching process upon the silicon "Device" layer using the silicon dioxide "Box" layer as an etching stopper. Also, the back surface side etching comprises performing a second deep reactive ion etching process upon the silicon "Handle" layer using the silicon dioxide "Box" layer as an etching stopper. Further, an exposed portion of the silicon dioxide "Box" layer is etched.

According to the presently disclosed subject matter, the dicing street is formed by double etching processes, so the width of the dicing street can be reduced to increase the integration, and the manufacturing cost can be reduced.

Also, since a wafer-level package such as a cap wafer is unnecessary, TSVs are unnecessary. Also, defective optical deflectors would be not assembled in a package. Therefore, the manufacturing cost would also be reduced.

BRIEF DESCRIPTION OF THE DRAWINGS

The above and other advantages and features of the presently disclosed subject matter will be more apparent from the following description of certain embodiments, taken in conjunction with the accompanying drawings, wherein:

FIG. 3 is flowchart for illustrating an embodiment of the method for manufacturing the optical deflector of FIGS. 1 and 2 according to the presently disclosed subject matter;

FIGS. 4A through 4I are cross-sectional views for explaining step 301 of FIG. 3;

FIGS. 6A and 6B area plan view and across-sectional view, respectively, for explaining the expanding step 309 of FIG. 3.

DETAILED DESCRIPTION OF EXEMPLARY EMBODIMENTS

Figure 1:
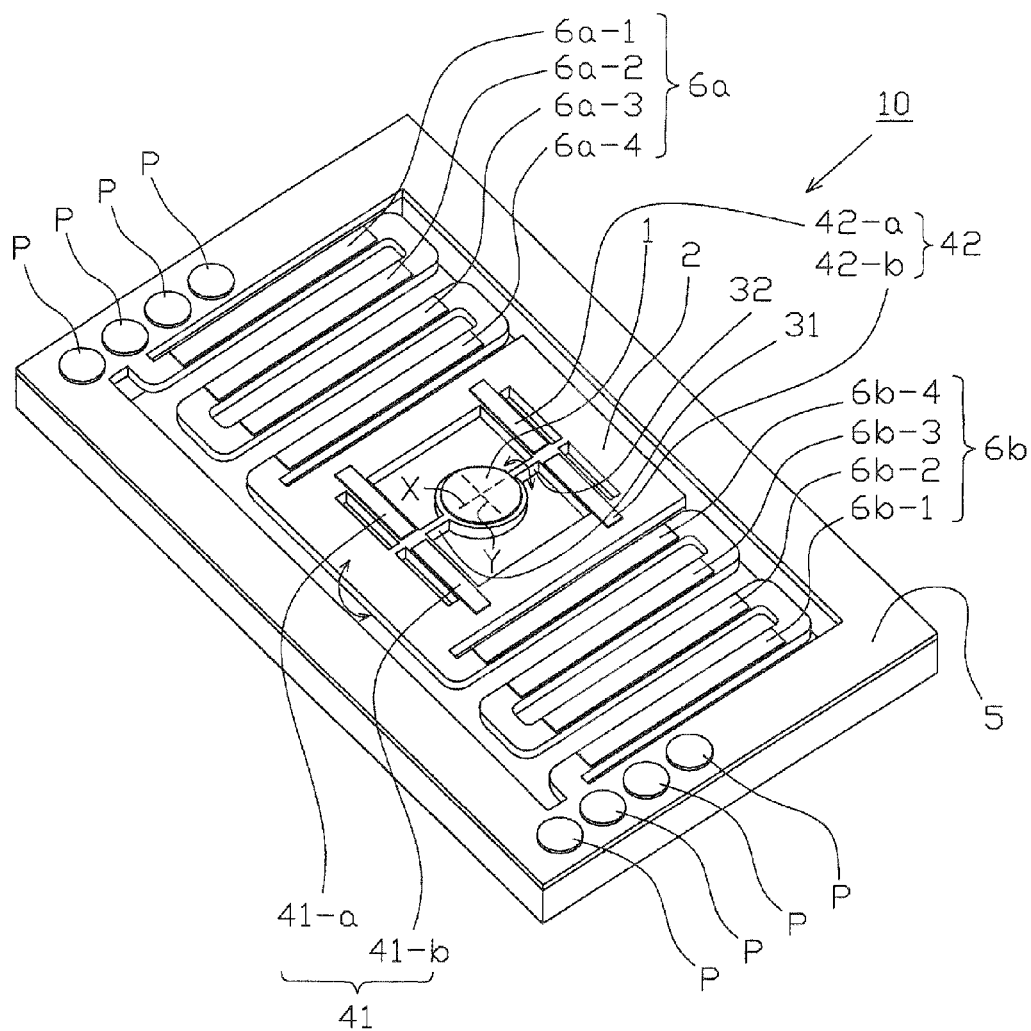
FIG. 1 is a perspective view illustrating an optical deflector to which the presently disclosed subject matter is applied.

In FIG. 1, which is a perspective view illustrating an optical deflector to which the presently disclosed subject matter is applied, this optical deflector is constructed by a circular mirror 1 for reflecting a spotlight (not shown), a movable frame 2 surrounding the mirror 1 for supporting the mirror 1 through a pair of torsion bars 31 and 32, a pair of inner piezoelectric actuators 41 and 42 of a torsion-bar type fixed between the movable frame 2 and the torsion bars 31 and 32 and serving as cantilevers for rocking the mirror 1 through the torsion bars 31 and 32 with respect to an X-axis of the mirror 1, a support body 5 surrounding the movable frame 2, and a pair of outer piezoelectric actuators 6a and 6b of a meander type fixed between the support body 5 and the movable frame 2 and serving as cantilevers for rocking the mirror 1 through the movable frame 2 with respect to a Y-axis of the mirror 1 perpendicular to the X-axis.

The torsion bars 31 and 32 are arranged along the X-axis, and have ends coupled to the inner circumference of the movable frame 2 and other ends coupled to the outer circumference of the mirror 1. Therefore, the torsion bars 31 and 32 are twisted by the inner piezoelectric actuators 41 and 42 to rock the mirror 1 with respect to the X-axis.

The inner piezoelectric actuator 41 is constructed by piezoelectric cantilevers 41-a and 41-b which oppose each other along the Y-axis and sandwich the torsion bar 31. The piezoelectric cantilevers 41-a and 41-b have ends coupled to the inner circumference of the movable frame 2 and other ends coupled to the torsion bar 31. In this case, the flexing direction of the piezoelectric cantilever 41-a is opposite to that of the piezoelectric cantilever 41-b.

Similarly, the inner piezoelectric actuator 42 is constructed by piezoelectric cantilevers 42-a and 42-b which oppose each other along the Y-axis and sandwich the torsion bar 32. The piezoelectric cantilevers 42-a and 42-b have ends coupled to the inner circumference of the movable frame 2 and other ends coupled to the torsion bar 32. In this case, the flexing direction of the piezoelectric cantilever 42-a is opposite to that of the piezoelectric cantilever 42-b.

The support body 5 is rectangularly-framed to surround the movable frame 2.

The outer piezoelectric actuators 6a and 6b are constructed by piezoelectric cantilevers 6a-1, 6a-2, 6a-3 and 6a-4; and 6b-1, 6b-2, 6b-3 and 6b-4, and are coupled between the inner circumference of the support body 5 and the outer circumference of the movable frame 2, in order to rock the movable frame 2 associated with the mirror 1 with respect to the support body 5, i.e., to rock the mirror 1 with respect to the Y-axis.

The piezoelectric cantilevers 6a-1, 6a-2, 6a-3 and 6a-4 are serially-coupled from the support body 5 to the movable frame 2. Also, each of the piezoelectric cantilevers 6a-1, 6a-2, 6a-3 and 6a-4 are in parallel with the X-axis of the mirror 1. Therefore, the piezoelectric cantilevers 6a-1, 6a-2, 6a-3 and 6a-4 are folded at every cantilever or meandering from the support body 5 to the movable frame 2, so that the amount of flexing of the piezoelectric cantilevers 6a-1, 6a-2, 6a-3 and 6a-4 can be changed along directions perpendicular to the Y-axis of the mirror 1.

Similarly, the piezoelectric cantilevers 6b-1, 6b-2, 6b-3 and 6b-4 are serially-coupled from the support body 5 to the movable frame 2. Also, each of the piezoelectric cantilevers 6b-1, 6b-2, 6b-3 and 6b-4 are in parallel with the X-axis of the mirror 1. Therefore, the piezoelectric cantilevers 6b-1, 6b-2, 6b-3 and 6b-4 are folded at every cantilever or meandering from the support body 5 to the movable frame 2, so that the amount of flexing of the piezoelectric cantilevers 6b-1, 6b-2, 6b-3 and 6b-4 can be changed along directions perpendicular to the Y-axis of the mirror 1.

Provided on the support body 5 are pads P which are connected to upper electrode layers and lower electrode layers of the inner piezoelectric actuators 41 and 42 and the outer piezoelectric actuators 6a and 6b.

The structure of each element of the optical deflector of FIG. 1 is explained next with reference to FIG. 2 which is a cross-sectional view of FIG. 1.

Figure 2:
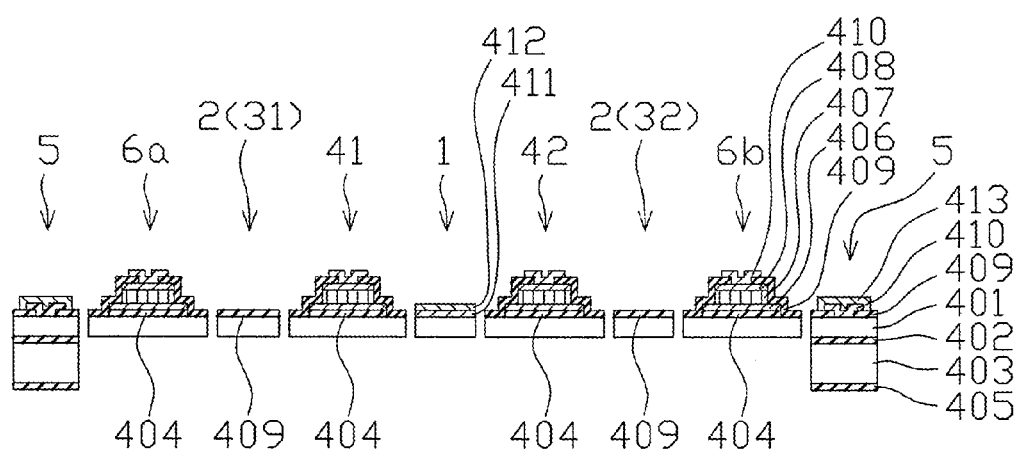
FIG. 2 is a cross-sectional view of the optical deflector of FIG. 1.

In FIG. 2, a silicon "Device" layer 401, a silicon dioxide "Box" layer 402 and a silicon "Handle" layer 403 are formed by a silicon-on-insulator (SOI) wafer. Also, reference numerals 404 and 405 designate silicon dioxide layers. Further, reference numeral 406 designates a Ti/Pt lower electrode layer, 407 designates a lead titanate zirconate (PZT) piezoelectric layer, and 408 designates a Pt upper electrode layer. Furthermore, reference numeral 409 designates a silicon dioxide layer. Further, reference numeral 410 designates an AlCu wiring layer. Further, reference numeral 411 designates a Ti layer, 412 designates an Ag layer, and 413 designates an Au layer.

The mirror 1 is constructed by the silicon "Device" layer 401, the Ti layer 411 and the Ag layer 412.

The movable frame 2 and the torsion bars 31 and 32 are constructed by the silicon "Device" layer 401 and the dioxide layer 409.

The inner piezoelectric actuators 41 and 42 and the outer piezoelectric actuators 6a and 6b are constructed by the silicon "Device" layer 401, the silicon dioxide layer 404, the Ti/Pt lower electrode layer 406, the PZT piezoelectric layer 407, the Pt upper electrode layer 408, the silicon dioxide layer 409 and the AlCu wiring layer 410.

The support body 5 is constructed by the silicon "Device" layer 401, the silicon dioxide "Box" layer 402, the silicon "Handle" layer 403, and the dioxide layers 405 and 409.

The pads P are constructed by the AlCu wiring layer 410 and the Au layer 413.

A method for manufacturing the optical deflector of FIGS. 1 and 2 according to the presently disclosed subject matter will be explained with reference to FIG. 3, 4A through 4I, 5A through 5H, 6A and 6B.

First, referring to step 301, a wafer-level optical deflector assembly is formed. This step 301 is explained in detail next with reference to FIGS. 4A through 4I.

Figure 4A:
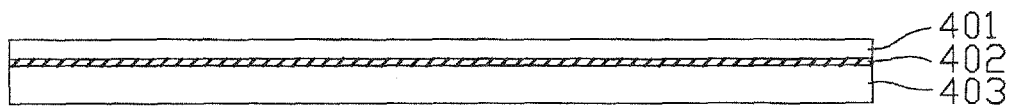

As illustrated in FIG. 4A, a silicon-on-insulator (SOI) wafer formed by an about 50 μm thick silicon "Device" layer 401, an about 2 μm thick silicon dioxide "Box" layer 402 and an about 400 μm thick silicon "Handle" layer 403 is prepared.

Figure 4B:
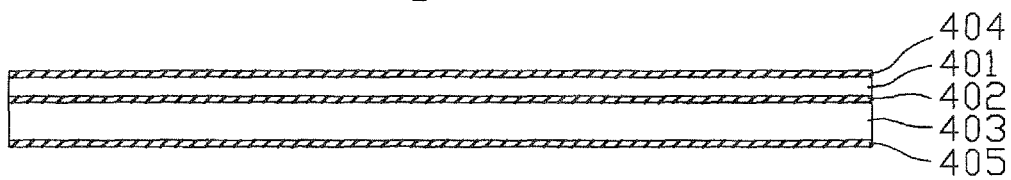

Then, as illustrated in FIG. 4B, a thermal oxidation process is performed upon the SOI wafer to grow about 500 nm thick silicon dioxide layers 404 and 405 on both surfaces of the SOI wafer.

Figure 4C:
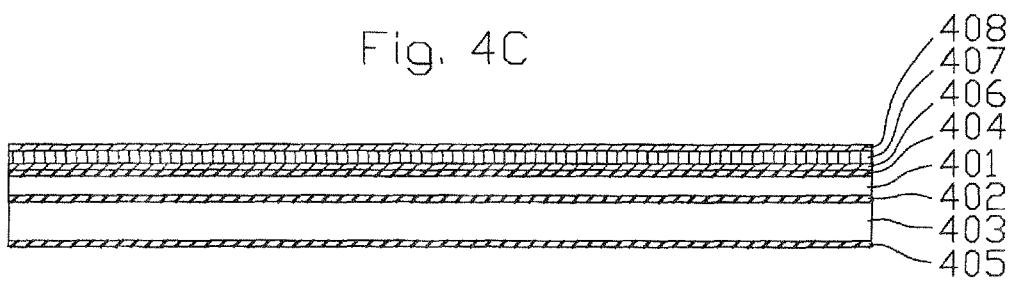

Then, as illustrated in FIG. 4C, an about 50 nm thick Ti layer and an about 150 nm thick Pt layer are sequentially deposited by a sputtering process to form a Ti/Pt lower electrode layer 406 on the silicon dioxide layer 404. Also, an about 3 μm thick lead titanate zirconate PbZrTiO$_3$ (PZT) piezoelectric layer 407 is deposited by an arc discharge reactive ion plating (ADRIP) process on the Ti/Pt lower electrode layer 406. Further, an about 150 nm thick Pt layer is deposited by a sputtering process to form a Pt upper electrode layer 408 on the PZT piezoelectric layer 407.

Figure 4D:
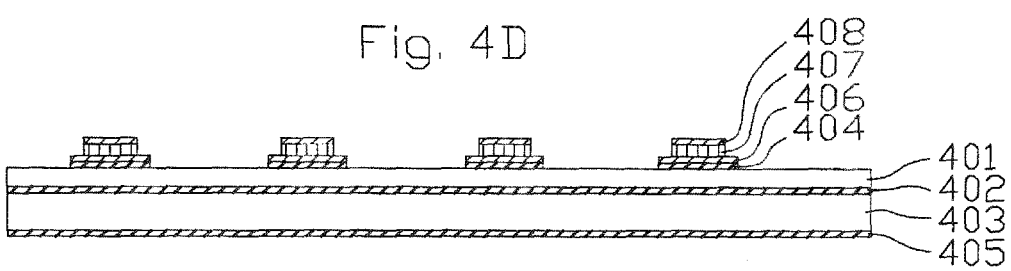

Then, as illustrated in FIG. 4D, the Pt upper electrode layer 408 and the PZT piezoelectric layer 407 are patterned by a photolithography and dry etching process, and the Ti/Pt lower electrode layer 406 and the silicon dioxide layer 404 are patterned by a photolithography and dry etching process, to form the inner piezoelectric actuators 41 and 42 and the outer piezoelectric actuators 6a and 6b.

Figure 4E:
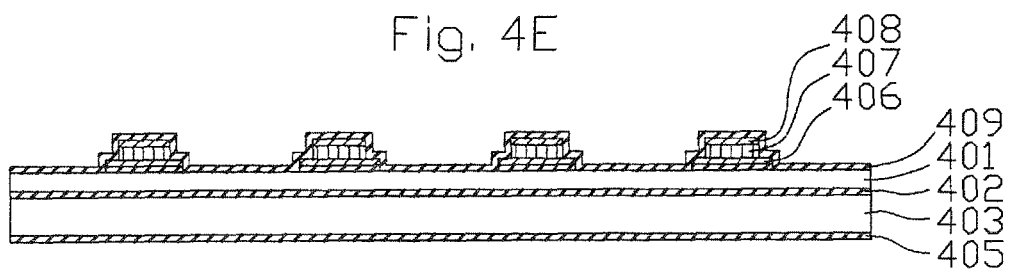

Then, as illustrated in FIG. 4E, an about 500 nm thick silicon dioxide layer 409 is deposited by a plasma chemical vapor deposition (CVD) process on the entire surface.

Figure 4F:
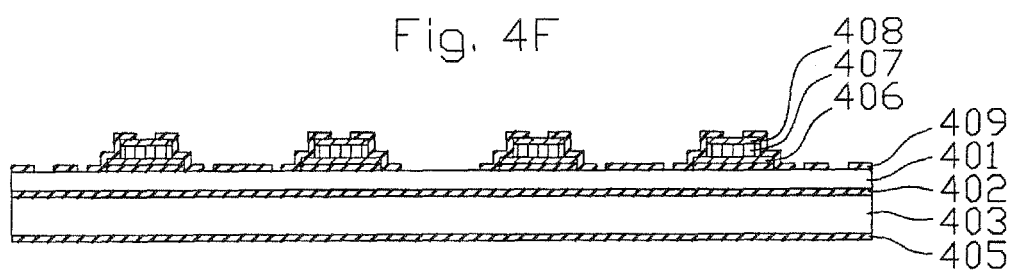

Then, as illustrated in FIG. 4F, a part of the silicon dioxide layer 409 is removed by a photolithography and dry etching process, so that contact holes are perforated in the silicon dioxide layer 409 at the inner piezoelectric actuators 41 and 42 and the outer piezoelectric actuators 6a and 6b and at portions where the pads P are to be formed.

Figure 4G:
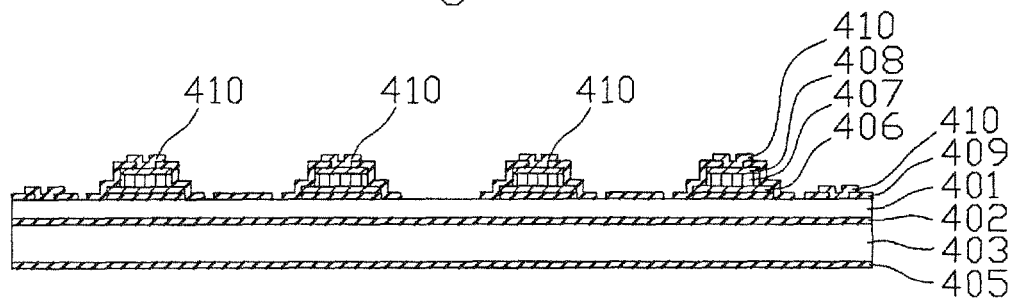

Then, as illustrated in FIG. 4G, a photoresist pattern is formed by a photolithography process, and an AlCu wiring layer 410 whose Cu component is 1% is deposited by a sputtering process. After that, the photoresist pattern is removed, so that the AlCu wiring layer 410 is patterned by a lift-off process. As a result, the upper electrode layers and the lower electrode layers of the inner piezoelectric actuators 41 and 42 and the outer piezoelectric actuators 6a and 6b will be electrically connected to their corresponding pads P.

Figure 4H:
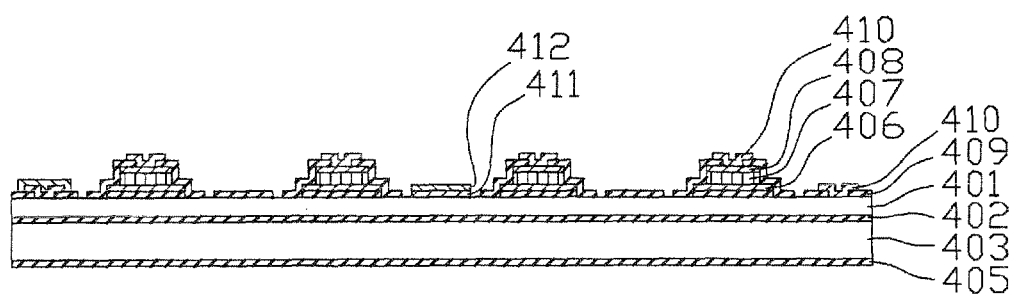

Then, as illustrated in FIG. 4H, a photoresist pattern is formed by a photolithography process, and a Ti layer 411 and an Ag layer 412 are sequentially deposited by a sputtering process. After that, the photoresist pattern is removed, so that the Ti layer 411 and the Ag layer 412 are patterned by a lift-off process. The Ti layer 411 and the Ag layer 412 form the mirror 1.

Then, as illustrated in FIG. 4I, a photoresist pattern is formed by a photolithography process, and an Au layer 413 is deposited by a sputtering process. After that, the photoresist pattern is removed, so that the Au layer 413 is patterned by a lift-off process. The patterned Au layer 413 forms the pads P.

Note that the lower figure of FIG. 4I includes three optical deflectors of the upper figure of FIG. 4I and will be used as a first stage for FIGS. 5A through 5H. In the lower figure of FIG. 4I and FIGS. 5A through 5H, the upper layers 406, 407, . . . , 413 are omitted in order to simplify the description.

Figure 5A:
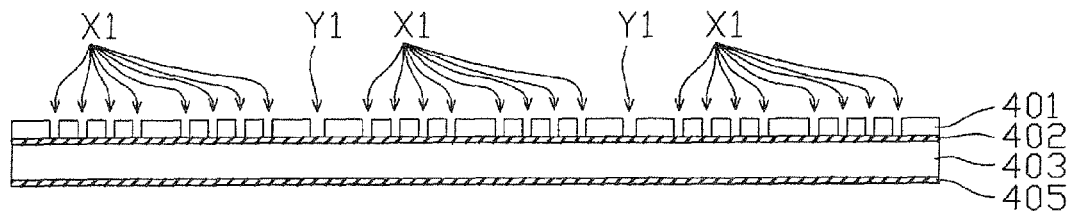
FIGS. 5A through 5H are cross-sectional views for explaining steps 302 through 309 of FIG. 3.

Returning to FIG. 3, at step 302, a first deep reactive ion etching (RIE) process is performed upon the front surface side of the SOI wafer of FIG. 4I by using the wafer-level optical deflector assembly, i.e., the non-silicon layers 406, 407, . . . , 413 as an etching mask and using said silicon dioxide "Box" layer 402 as an etching stopper. Note that the deep RIE process is called a "Bosch" process which alternates an isotropic etching step using SF$_6$ gas upon the bottom of a silicon portion to be etched with a protecting step using C$_4$F$_8$ gas for protecting the sidewalls of the silicon portion from being etched. The first deep RIE process is stopped by an etching stopper, i.e., the silicon dioxide "Box" layer 402. As a result, as illustrated in FIG. 5A, recesses indicated by X1 where the layers 406, 407, . . . , 413 are not provided and a front-side dicing street indicated by Y1 are created in the "Device" layer 401.

Figure 5B:
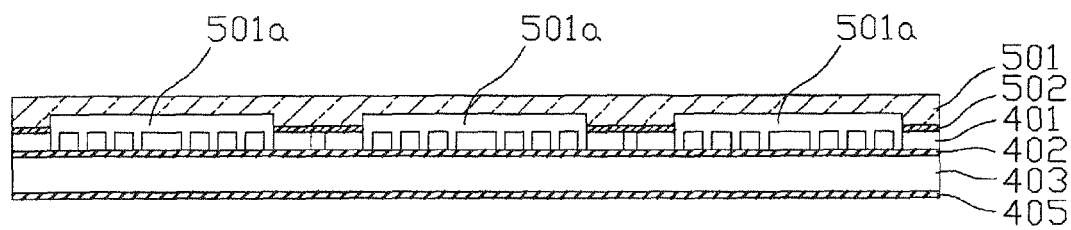

Next, referring to step 303, a transparent substrate 501 is provisionally adhered by an adhesive element 502 to the front surface of the SOI wafer while aligning the transparent substrate 501 with the SOI wafer by the optical transmission. That is, as illustrated in FIG. 5B, the transparent substrate 501 has an inside cavity 501a so that the transparent substrate 501 is adhered to an immovable element, i.e., the support body 5 while the inside cavity 501a opposes movable elements, i.e., the mirror 1, the movable frame 2, the torsion bars 31 and 32, the inner piezoelectric actuators 41 and 42 and the outer piezoelectric actuators 6a and 6b so that they are not in contact with the transparent substrate 501.

The transparent substrate 501 is made of glass or quartz which can be reused by performing a rising process thereupon.

Also, the adhesive element 502 is made of an ultraviolet-wiring tape, a thermoset tape, resist, wax or other adhesive material. The adhesive element 502 preferably has a release property with no residue on the front surface of the SOI wafer after release.

Figure 5C:
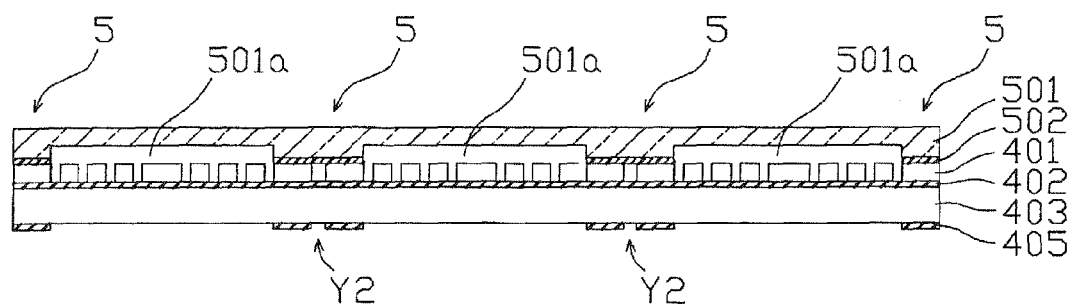

Next, referring to step 304, the silicon dioxide layer 405 is patterned by a photolithography and etching process to form an etching mask. That is, as illustrated in FIG. 5C, the patterned silicon dioxide layer 405 indicates the support body 5 and a back-side dicing street indicated by Y2 in the silicon dioxide layer 405.

Figure 5D:
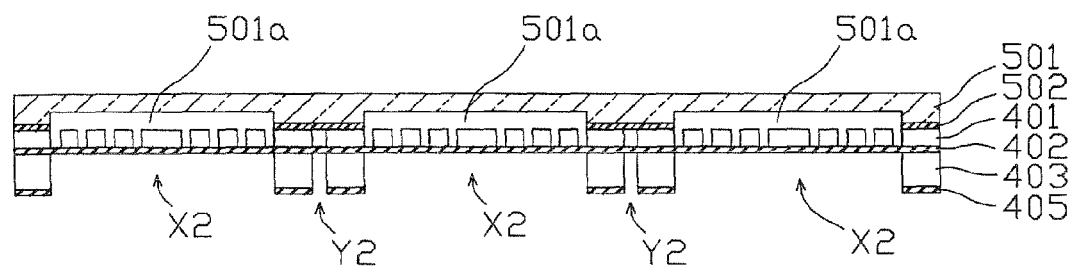

Next, referring to step 305, a second deep RIE process is performed upon the back surface side of the SOI wafer, i.e., the silicon "Handle" layer 403 by using the patterned silicon dioxide layer 405 as an etching mask. The second deep RIE process is stopped by an etching stopper, i.e., the silicon dioxide "Box" layer 402. As a result, as illustrated in FIG. 5D, a cavity indicated by X2 opposing the above-mentioned movable elements and a back-side dicing street indicated by Y2 are created in the "Handle" layer 403.

Figure 5E:
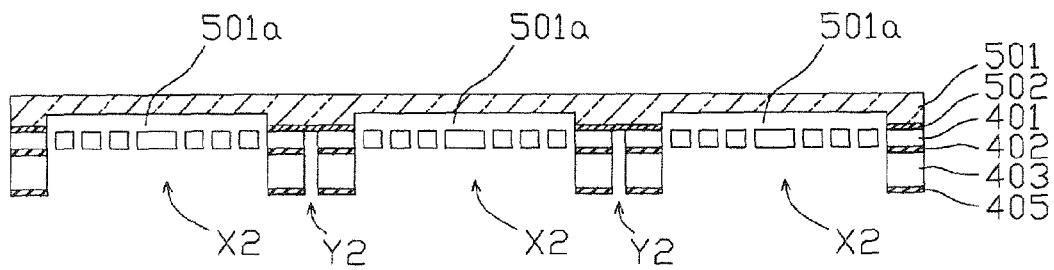

Next, referring to step 306, the exposed "Box" layer 402 is etched by a dry etching process using CF$_4$ gas. Therefore, as illustrated in FIG. 5E, the mirror 1, the movable frame 2, the torsion bars 31 and 32, the inner piezoelectric actuators 41 and 42 and the outer piezoelectric actuators 6a and 6b can move within the inside cavity 501a of the transparent substrate 501. Simultaneously, the front-side dicing street Y1 leads to the back-side dicing street Y2. As a result, each of the optical deflectors can be separated from each other; however, the optical deflectors are never separated from each other by the transparent substrate 501.

Figure 5F:
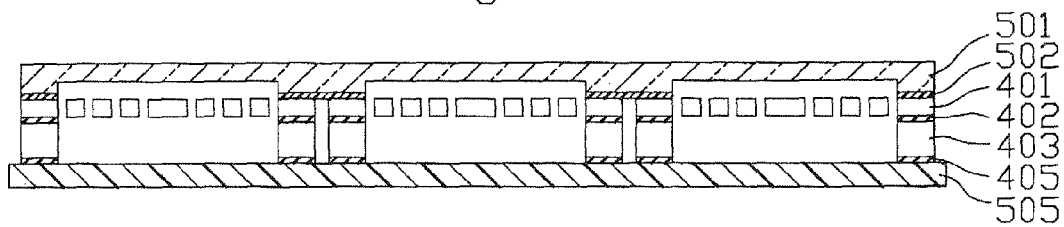

Next, referring to step 307, an adhesive sheet 505 with a ring-shaped rim 506 (see: FIGS. 6A and 6B) is adhered to the back surface of the SOI wafer. That is, as illustrated in FIG. 5F, the adhesive sheet 505 is adhered to the silicon dioxide layer 405.

Figure 5G:
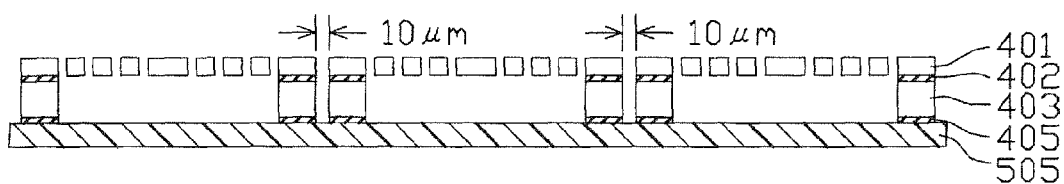

Next, referring to step 308, the transparent substrate 501 is removed from the SOI wafer. That is, as illustrated in FIG. 5G, if the adhesive element 502 is made of an ultraviolet tape, the adhesive element 502 is irradiated with ultraviolet rays through the transparent substrate 501, the adhesive element 502 loses its adhesive force, so that the transparent substrate 501 is removed from the SOI wafer. Note that, if the adhesive element 502 is made of a thermoset tape, the adhesive element 502 is heated. Also, if the adhesive element 502 is made of resist, the adhesive element 502 is dipped in solvent. Further, if the adhesive element 502 is made of wax, the adhesive element 502 is dipped in hot water at a temperature from 60° C. to 90° C.

Figure 5H:
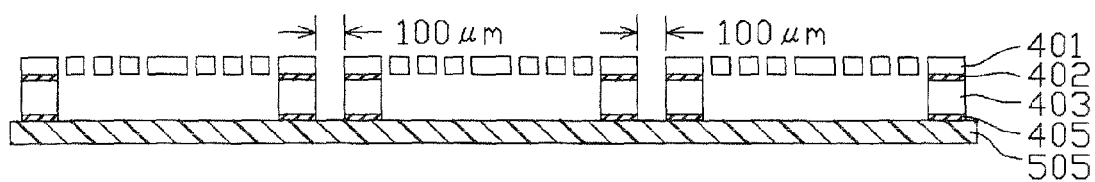

Next, referring to step 309, an expanding process is performed upon the ring-shaped rim 506, so that each optical deflector is picked up by using a vacuum collet (not shown). That is, as illustrated in FIG. 5H, the width of the dicing street (Y1, Y2) is increased from about 10 μm to about 100 μm by expanding the ring-shaped rim 506 as illustrated in FIGS. 6A and 6B. In this case, the angle of the dicing street (Y1, Y2) with respect to the plane of the SOI wafer is preferably within 90°±0.2°, and the fluctuation of the width of the dicing street (Y1, Y2) is preferably within ±2 μm. Therefore, when each optical deflector is picked up, no tipping would be generated which would reduce the manufacturing cost. Thus, the optical deflector as illustrated in FIGS. 1 and 2 is obtained.

Next, referring to step 310, a testing process is performed upon each picked-up optical deflector to evaluate the electrical characteristics of the inner piezoelectric actuators 41 and 42 and the outer piezoelectric actuators 6a and 6b and the like. Only the optical deflectors which have passed the testing process proceed to step 311, which would further reduce the manufacturing cost.

Finally, referring to step 311, a packaging process is performed upon only the passed optical deflectors, and the pads P of the optical deflector are wire-bonded to a package.

According to the above-described embodiment, since the width of the dicing street (Y1, Y2) is very small, i.e., about 10 μm as compared with the width about 100 μm of the conventional dicing street using dicing blades, the integration of optical deflectors in one wafer is enhanced which would also reduce the manufacturing cost.

Further, since a testing process is carried out before the packaging, it is unnecessary to package defective optical deflectors, so that the manufacturing cost would further be reduced.

According to the above-described embodiment, when sinusoidal-wave drive voltages having an amplitude of 20 V and a frequency of 27 kHz were applied to the inner piezoelectric actuators 41 and 42, and saw-tooth-shaped-wave drive voltages having an amplitude of 20 V and a frequency of 60 Hz were applied to the outer piezoelectric actuators 6a and 6b, the deflection angle with respect to the X-direction was ±13° and the deflection angle with respect to the Y-direction was ±9°.

Also, since no tipping was generated during the expanding and picking-up step, the manufacturing yield was 90% or over, and the fluctuation of the deflection angles and the driven frequency were within ±3%.

In the above-described embodiments, the optical deflector constitutes a two-dimensional optical deflector where the inner actuators are torsion-bar type piezoelectric actuators and the outer actuators are meander type piezoelectric actuators; however, the presently disclosed subject matter can be applied to other two-dimensional optical deflectors. Also, the presently disclosed subject matter can be applied to a one-dimensional optical deflector.

It will be apparent to those skilled in the art that various modifications and variations can be made in the presently disclosed subject matter without departing from the spirit or scope of the presently disclosed subject matter. Thus, it is intended that the presently disclosed subject matter covers the modifications and variations of the presently disclosed subject matter provided they come within the scope of the appended claims and their equivalents. All related or prior art references described above and in the Background section of the present specification are hereby incorporated in their entirety by reference.

The invention claimed is:

1. A method for manufacturing an optical deflector, comprising:
    forming a wafer-level optical deflector assembly on a front surface side of a wafer;
    etching the front surface side of said wafer by using elements of said wafer-level optical deflector assembly as a first etching mask, to form a front-side dicing street in the front surface side of said wafer;
    provisionally adhering a transparent substrate with an inside cavity to the front surface side of said wafer, in such a way that the inside cavity of said transparent substrate opposes movable elements of said wafer-level optical deflector assembly;
    forming a second etching mask on a back surface side of said wafer;
    etching the back surface side of said wafer by using said second etching mask in such a way that a cavity opposing the movable elements of said wafer-level optical deflector assembly and a back-side dicing street are created in the back surface side of said wafer, said back-side dicing street leading to said front-side dicing street;
    adhering an adhesive sheet with a ring-shaped rim to the back surface side of said wafer, after the back surface side of said wafer is etched;
    removing said transparent substrate from the front surface side of said wafer, after said adhesive sheet is adhered to the back surface side of said wafer; and
    expanding said ring-shaped rim to widen said front-side dicing street and said back-side dicing street to pick up optical deflectors one by one from said wafer, after said transparent substrate is removed.

2. The method as set forth in claim 1, wherein said wafer comprises a silicon-on-insulator wafer including a silicon "Device" layer, a silicon dioxide "Box" layer and a silicon "Handle" layer in this sequence.

3. The method as set forth in claim 2, wherein said front surface side etching comprises performing a first deep reactive ion etching process upon said silicon "Device" layer using said silicon dioxide "Box" layer as an etching stopper.

4. The method as set forth in claim 2, wherein said back surface side etching comprises performing a second deep reactive ion etching process upon said silicon "Handle" layer using said silicon dioxide "Box" layer as an etching stopper.

5. The method as set forth in claim 2, further comprising etching an exposed portion of said silicon dioxide "Box" layer after the back surface side of said wafer is etched.

6. The method as set forth in claim 1, wherein said transparent substrate adhering comprises adhering said transparent substrate to the front surface side of said wafer using an adhesive element with release property.

7. The method as set forth in claim 6, wherein said adhesive element comprises an ultraviolet tape, said transparent substrate removing comprising irradiating said ultraviolet tape with ultraviolet rays.

8. The method as set forth in claim 6, wherein said adhesive element comprises a thermoset tape, said transparent substrate removing comprising heating said thermoset tape.

9. The method as set forth in claim 6, wherein said adhesive element comprises resist, said transparent substrate removing comprising dipping said resist in solvent.

10. The method as set forth in claim 6, wherein said adhesive element comprises wax, said transparent substrate removing comprising dipping said wax in hot water at a temperature from 60° C. to 90° C.

11. The method as set forth in claim 1, further comprising:

performing a testing process upon said picked-up optical deflectors; and packaging only ones of said optical deflectors that have passed said testing.

12. The method as set forth in claim 1, wherein said transparent substrate is made of one of glass and quartz.

* * * * *